United States Patent [19]
Murakami et al.

[11] Patent Number: 6,132,224
[45] Date of Patent: Oct. 17, 2000

[54] CONNECTOR ASSEMBLY FOR PRINTED CIRCUIT

[75] Inventors: Takao Murakami; Masaya Yamamoto, both of Shizuoka, Japan

[73] Assignee: Yazaki Corporation, Tokyo, Japan

[21] Appl. No.: 09/295,419

[22] Filed: Apr. 21, 1999

[30] Foreign Application Priority Data

Apr. 24, 1998 [JP] Japan ................................. 10-115006

[51] Int. Cl.[7] .................................................... H01R 9/09
[52] U.S. Cl. ............................ 439/77; 439/260; 439/265
[58] Field of Search ............................. 439/77, 260, 265, 439/59, 499, 495, 327

[56] References Cited

U.S. PATENT DOCUMENTS

| | | | |
|---|---|---|---|
| 3,417,362 | 12/1968 | Reynolds | 439/77 |
| 5,230,636 | 7/1993 | Masuda et al. | 439/358 |
| 5,238,414 | 8/1993 | Yaegashi et al. | |
| 5,704,812 | 1/1998 | Moji | 439/265 |

FOREIGN PATENT DOCUMENTS

| | | |
|---|---|---|
| 50-63593 | 6/1975 | Japan . |
| 55-164783 | 11/1980 | Japan . |
| 57-136191 | 8/1982 | Japan . |
| WO 95/17774 A1 | 6/1995 | WIPO . |

OTHER PUBLICATIONS

IBM Technical Disclosure Bulletin, vol. 32, No. 5a, Oct. 1989, "High Density Edge Connector".

*Primary Examiner*—Brian Sircus
*Assistant Examiner*—J. F. Duverne
*Attorney, Agent, or Firm*—Armstrong, Westerman, Hattori, McLeland & Naughton

[57] ABSTRACT

A connector assembly for a printed circuit is provided, which includes: a connector receiving portion (36) arranged with a printed circuit having a strip-like flat-terminal portion (52, 53); a connector (31) to be received in the connector receiving portion and having a connector housing (32) and a plurality of terminal accommodating chambers (40, 40') symmetrically arranged each other on both sides of a space (39) having a predetermined interval, wherein an opening portion (41, 42, 41', 42') is provided on both of an isolation wall (40b, 40b') facing the space (39) and the opposite isolation wall (40a, 40'a) of each of the terminal accommodating chambers (40, 40') so as to connect each of the terminal accommodating chambers (40, 40') with the outside; and an electric terminal (33),
having an elastically contacting piece (47) formed with a pair of contacting portions (49, 50) each capable of contacting the flat-terminal portion of the printed circuit through the opening portion, to be accommodated in each of the terminal accommodating chambers (40, 40').

2 Claims, 6 Drawing Sheets

CONNECTOR ASSEMBLY FOR PRINTED CIRCUIT

BACKGROUND OF THE INVENTION

1. Field of the Invention

The present invention generally relates to a connector assembly for printed circuit and more particularly, to a connector assembly for printed circuit applicable to both of a flexible printed circuit and a hard printed circuit arranged in a connector receiving portion.

2. Description of the Related Art

FIG. 8 shows a connector 1 for a flexible printed circuit (hereinafter "FPC") 6. The connector 1 has a rectangular connector housing 2 with a plurality of terminal accommodating chambers 3 (only one chamber is shown in FIG. 8) each having an electric terminal 5 with an elastically contacting piece 4 therein. The connector 1 is received in a connector receiving portion 7 provided with the FPC 6.

An opening portion 8 is formed on the terminal accommodating chamber 3 on the side of a wall of the connector receiving portion 7 provided with the FPC 6, and the elastically contacting piece 4 projects from the opening portion 8 by a predetermined amount.

And, an opening 9 is formed at the rear end of the terminal accommodating chamber 3, and the electric terminal 5 is accommodated in the terminal accommodating chamber 3.

The electric terminal 5 is made of a conductive metal and consists of an electrical contact portion 10 with the elastically contacting piece 4 and a wire connecting portion 12 to which an electric wire 11 is to be connected. A contacting portion 13 to project from the opening portion 8 is formed on the elastically contacting piece 4 in the midway of a part turning up from an end portion thereof toward the wire connecting portion 12.

The connector receiving portion 7 is formed by denting an equipment casing 14 so as to receive the connector housing 2. On the FPC 6 arranged on the connector receiving portion 7, a plurality of strip-like flat-terminal portions (not shown) to be put into contact with the contacting portions 13 of the respective electric terminals 5 are provided. Upon insertion of the connector 1 into the connector receiving portion 7, the elastically contacting piece 4 bends, while being in contact with the flat-terminal portion (not shown) and pushing the flat-terminal portion with necessary resilience, and thereby electrical connection is made.

On the other hand, FIG. 9 shows a card-edge connector 15 for a hard printed circuit 20. The card-edge connector 15 consists of a rectangular connector housing 16 having a plurality of terminal accommodating chambers 17,17' (each one chamber is shown in FIG. 9) divided into two layers and electric terminals 19, each having an elastically contacting piece 18, to be inserted into the respective terminal accommodating chambers 17,17'. The card-edge connector 15 is received in the connector receiving portion 21 provided centrally with a hard printed circuit (a wiring board; hereinafter "HPC") 20.

In the center of the connector housing 16 and between the terminal accommodating chambers 17,17', a space 22 for receiving the HPC 20 is provided. The terminal accommodating chambers 17,17' are provided with respective opening portions 23,23' to communicate with the space 22.

The electric terminal 19 is made of a conductive metal and consists of an electrical contact portion 24 with the elastically contacting piece 18 and a wire connecting portion 26 to which an electric wire 25 is to be connected. A contacting portion 27 to project from each of the opening portions 23,23' is formed on the elastically contacting piece 18 in the midway of a part turning up from an end portion thereof toward the wire connecting portion 26.

The connector receiving portion 21 is formed by denting an equipment casing 28 so as to receive the connector housing 16. A plurality of strip-like flat-terminal portions (not shown) to be put between the elastically contacting pieces 18 and to be put into contact with the contacting portions 27 are provided on the front and back sides of the HPC 20.

Upon insertion of the card-edge connector 15 into the connector receiving portion 21, the elastically contacting piece 18 bends, while being in contact with the flat-terminal portion (not shown) of the HPC 20 and pushing the flat-terminal portion with necessary resilience, and thereby electrical connection is made.

With respect to the above conventional structures, the connector 1 in FIG. 8 and the card-edge connector 15 in FIG. 9 each are used as an exclusive use connector.

In the production spot, however, increase of such exclusive connectors makes parts, molding form or the like more complicated.

Also, an electronic parts (not shown) or the like are mounted on the HPC 20. In case of connecting the HPC 20 to the FPC 6 with, for example, only a wiring function, the electric wire 25 connected to the card-edge connector 15 and the electric wire 11 connected to the connector 1 have to be directly connected between the card-edge connector 15 and the connector 1. This connection needs a lot of parts and therefore is one of factors increasing a production cost.

SUMMARY OF THE INVENTION

In view of the foregoing, an object of the present invention is to provide a connector assembly for printed circuit, wherein a connector is applicable to both of a flexible printed circuit and a hard printed circuit each to be provided on a connector receiving portion and, thereby, reduction of the number of parts, metal mold and the like and simultaneously lightening of parts control are attained.

In order to achieve the above-described object, as a first aspect of the present invention, a connector assembly for printed circuit consists of: a first connector arranged with a printed circuit having a strip-like flat-terminal portion; a second connector to be received in the first connector and having a connector housing and a plurality of terminal accommodating chambers symmetrically arranged each other on both sides of a space having a predetermined interval, wherein an opening portion is provided on both of an isolation wall facing the space and the opposite isolation wall of each of the terminal accommodating chambers so as to connect each of the terminal accommodating chambers with the outside; and an electric terminal, having an elastically contacting piece formed with a pair of contacting portions each capable of getting contact with the flat-terminal portion of the printed circuit through the opening portion, to be accommodated in each of the terminal accommodating chambers.

As a second aspect of the present invention, in the structure with the above first aspect, the printed circuit of the first connector is any one of a flexible printed circuit, a hard printed circuit, and combination of the flexible printed circuit and the hard printed circuit.

According to the present invention as described hereinabove, since the second connector is applicable to both of the flexible printed circuit and the hard printed circuit each to be provided on the first connector, that is, since common use of a connector is realized, reduction of the number of parts and metal mold and the like, and lightening of parts control are attained simultaneously.

The above and other objects and features of the present invention will become more apparent from the following description taken in conjunction with the accompanying drawings.

DESCRIPTION OF THE PREFERRED EMBODIMENT

An embodiment of the present invention will now be described in further detail with reference to the accompanying drawings.

Figure 1:
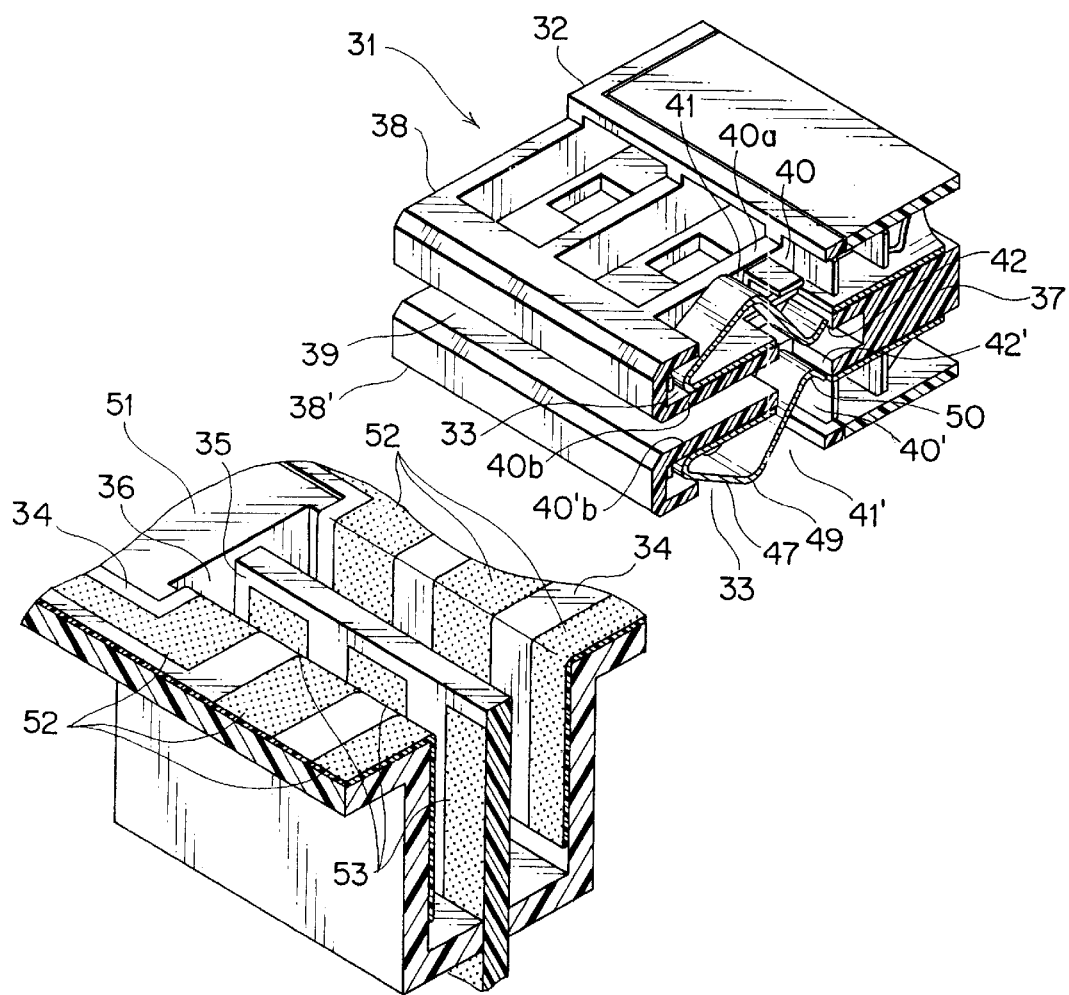
FIG. 1 is a perspective view showing an embodiment of a connector assembly for printed circuit according to the present invention.

FIG. 1 is a perspective view showing an embodiment of a connector assembly for printed circuit in accordance with the present invention. And, FIG. 2 is a sectional view of the connector of FIG. 1.

Figure 2:
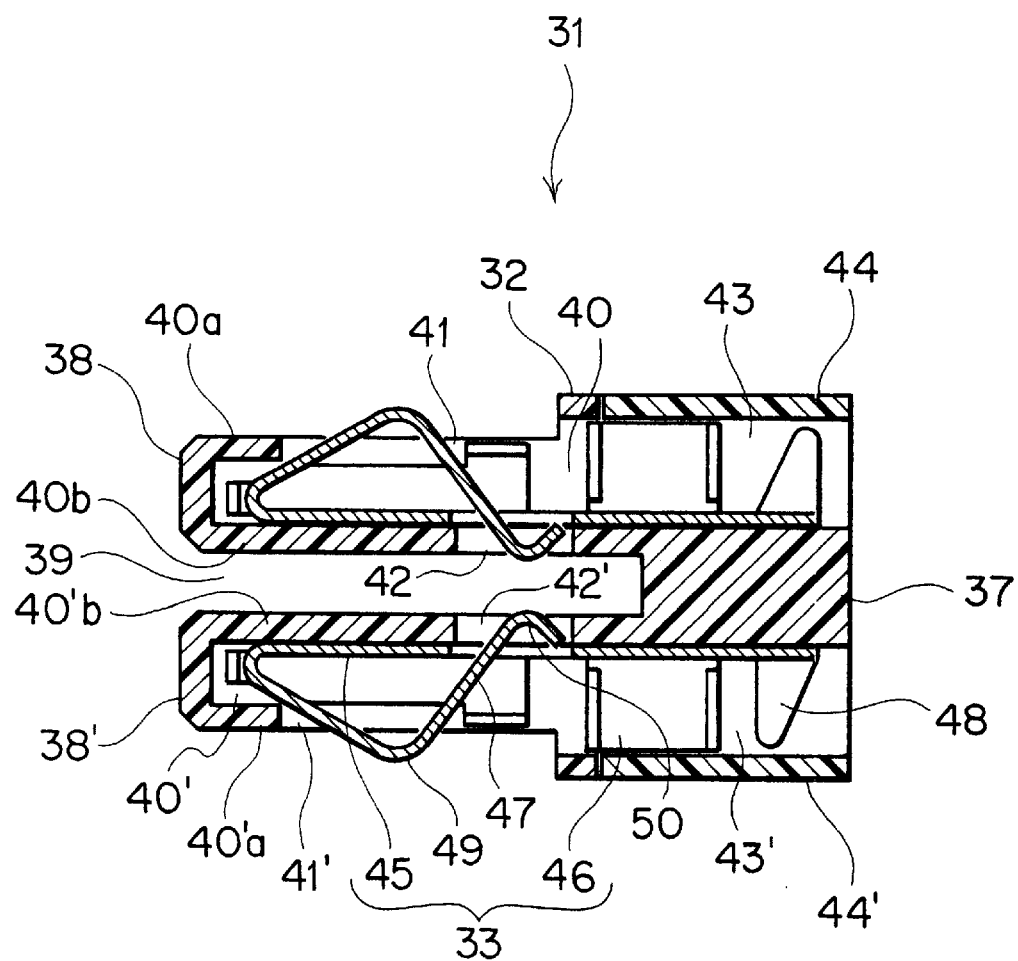
FIG. 2 is a sectional view of the connector of FIG. 1.

In FIG. 1 and FIG. 2, 31 shows a connector for printed circuit such as a flexible printed circuit and a hard printed circuit.

The connector 31 consists of a connector housing 32 and a plurality of electric terminals 33. In a connector receiving portion 36, any one of a flexible printed circuits 34, a hard print circuit 35 (equivalent to a wiring board of known structure), and combination of the flexible printed circuit 34 and the hard printed circuit 35 is arranged. The connector 31 is received in the connector receiving portion 36.

In the present embodiment, an example that the flexible printed circuit 34 and the hard printed circuit 35 coexist is described. And, in the following description, the flexible printed circuit and the hard printed circuit are sketched with merely FPC and HPC.

The connector housing 32 is made of synthetic resin, and a pair of rectangular terminal Accommodating Portions 38,38' Project Symmetrically from a basal part 37. Between the pair of terminal accommodating portions 38,38', a space 39 having an interval to receive the HPC 35 is formed.

And, in the inside of the terminal accommodating portions 38,38', a plurality of terminal accommodating chambers 40,40' for the electric terminals 33 are provided. On isolation walls 40a,40b, and 40'a,40b of the terminal accommodating chambers 40,40', rectangular opening portions 41,42 and 41',42' are formed, respectively.

In the present embodiment, the opening portions 41,41' are formed on almost whole the surfaces of the isolation walls 40a,40'a of the terminal accommodating chambers 40,40'. And, the opening portions 42,42' are formed on the intermediate part of the isolation walls 40b,40b of the respective terminal accommodating chambers 40,40', communicating with the space 39.

And, as shown in FIG. 2, opening portions 43,43' for pressure-welding electric wires on the electric terminals 33 are formed on the basal part 37, and covers 44,44' are provided on the opening portions 43,43'.

Figure 3:
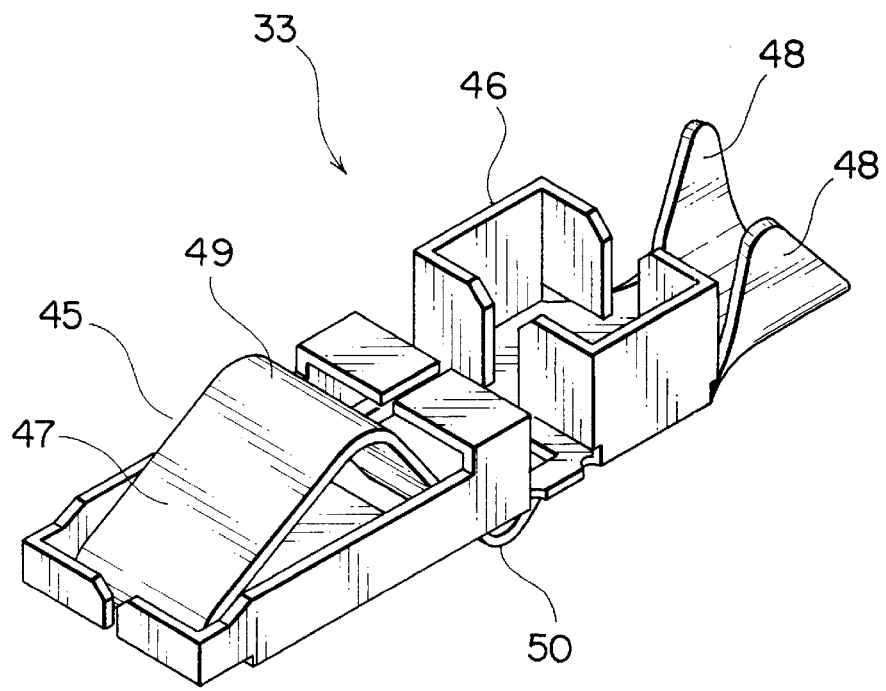
FIG. 3 is a perspective view of an electric terminal shown in FIG. 1.
Figure 4:
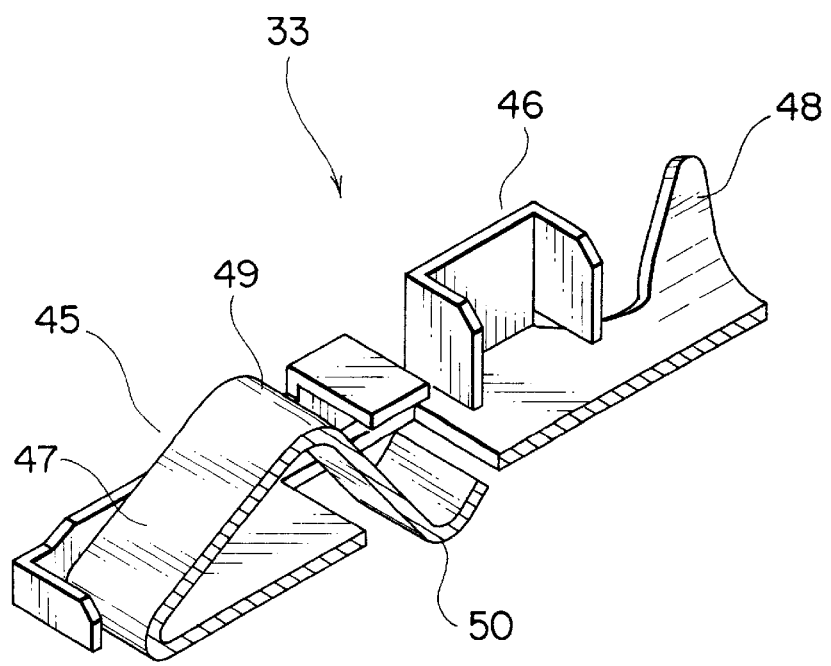
FIG. 4 is a perspective sectional view of the electric terminal of FIG. 3.

The electric terminal 33 is formed as shown in FIG. 3 and FIG. 4 by pressing a conductive metal plate (copper, beryllium-copper or the like) and by bending the pressed plate. The electric terminal 33 consists of an electrical contact portion 45 and a wire connecting portion 46 continuing to the electrical contact portion 45.

A rectangular elastically contacting piece 47 is bendingly formed at the end portion of the electrical contact portion 45. And, fixing pieces 48 are provided on the wire connecting portion 46.

The elastically contacting piece 47 is formed in a S-like shape having a mountain and a valley in an intermediate portion thereof, and the two tops form contacting portions 49,50, respective. And, the contacting portions 49 have a height to project from the respective opening portions 41,41' to the outside of the connector housing 32 by a predetermined amount, and the contacting portions 50 have a height to project from the opening portions 42,42' to the space 39.

Here, the electric terminal 33 is not limited to the shape shown in FIG. 3 and FIG. 4 and is acceptable if an elastically contacting piece with at least two contacting portions projecting from such opening portions as 41,42 is provided thereon.

Also in FIG. 1, the connector receiving portion 36 is formed so as to receive the connector housing 32 by hollowing an equipment casing 51 to be mounted on a vehicle (not shown) or the like. In the inside of the connector receiving portion 36, both of the FPC 34 and HPC 35 are provided.

More specifically, the FPC 34 is drawn between both of side walls 36a of the connector receiving portion 36 (FIG. 5) along the equipment casing 51 and installed by a known fixing means such as adhesion. And, the HPC 35 provided inside the equipment casing 51 penetrates depths-wall 36b (FIG. 5) of the connector receiving portion 36 and arranged between the side walls 36a.

A plurality of strip-like flat-terminal portions 52 are formed on the FPC 34 and also a plurality of strip-like flat-terminal portions 53 are formed on the front and back sides of the HPC 35. The flat-terminal portions 52,53 have width corresponding to the respective contacting portions 49,50 of the electric terminal 33 and connected to a load (not shown) or the like.

Figure 5:
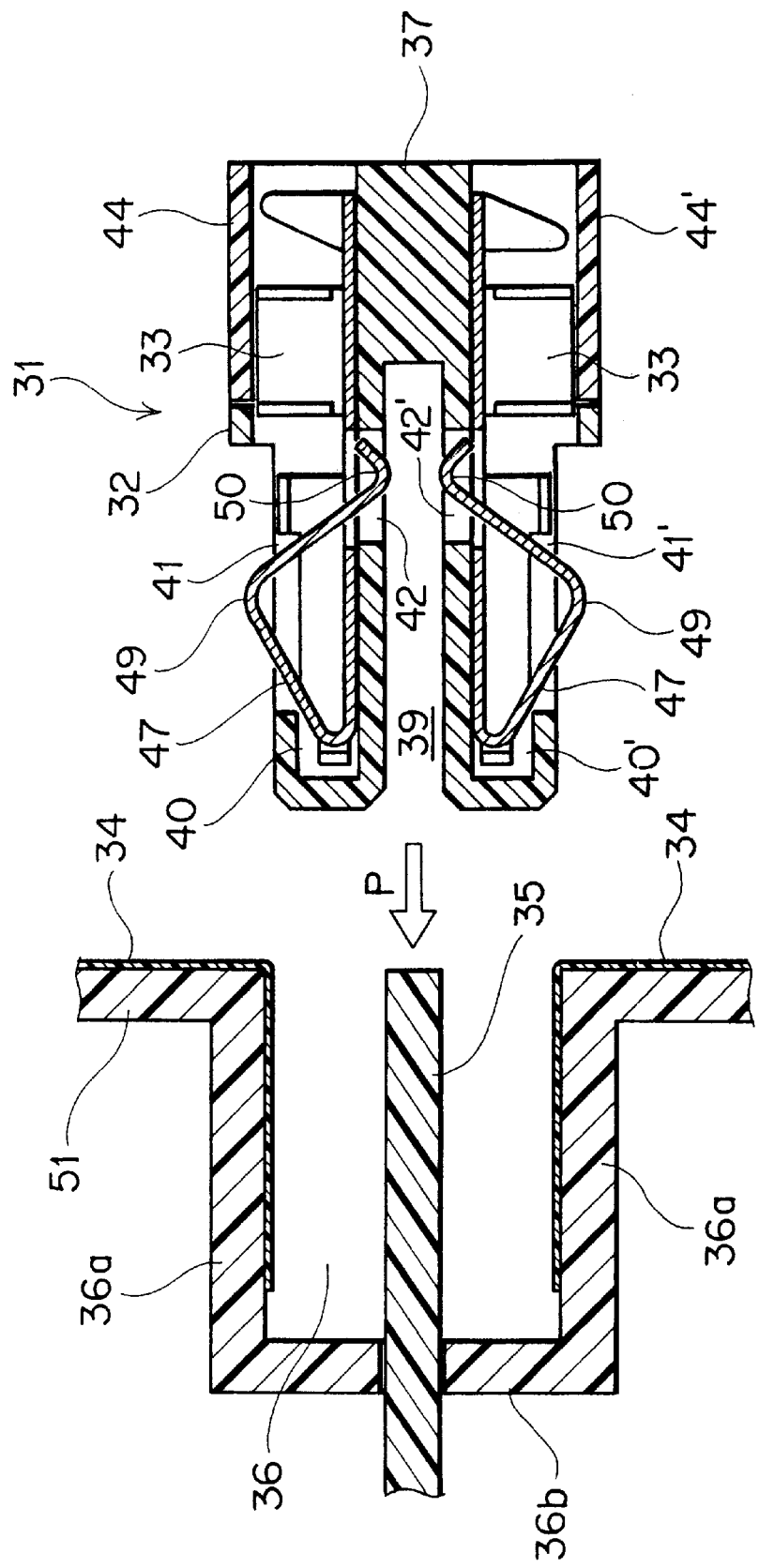
FIG. 5 is a longitudinal-sectional view showing a state of insertion of the connector into the connector receiving portion of FIG. 1.

Hereinafter, referring to FIG. 5, an electrically connected state between the elastically contacting piece 47 and the flat-terminal portions 52,53 in a state that the connector 31 is inserted in the connector receiving portion 36 is explained.

First, assembly of the connector 31 is explained. The connector 31 is formed by inserting the electric terminals 33 in the terminal accommodating chambers 40,40' of the connector housing 32 and by fitting the covers 44,44' on the basal part 37.

Next, the connector 31 formed in this way is inserted into the connector receiving portion 36 in an arrow P direction, while inserting the HPC35 in the space 39. And, the elastically contacting pieces 47 bend inwardly when the contacting portions 49 projecting from the opening portions 41,41' slide on the flat-terminal portions 52 of the FPC 34. Afterward, the edged end of the elastically contacting piece 47 shifts toward the wire connecting portion 46 when the contacting portion 50 of the elastically contacting piece 47 abuts on the end of the HPC 35. Simultaneously, the contacting portion 50 bends outwardly and comes into contact with the flat-terminal portion 53. Since the elastically contacting pieces 47 deform like compressed, contact pressure of the contacting portions 49,50 against the respective flat-terminal portions 52,53 is raised due to resilience of the elastically contacting pieces 47.

As described above, the connector 31 is put into contact with both of the FPC 34 and the HPC 35 and directly connects these. That is, the connector 31 acts as a relaying connector and fills a role of two connectors conventionally required.

Figure 6:
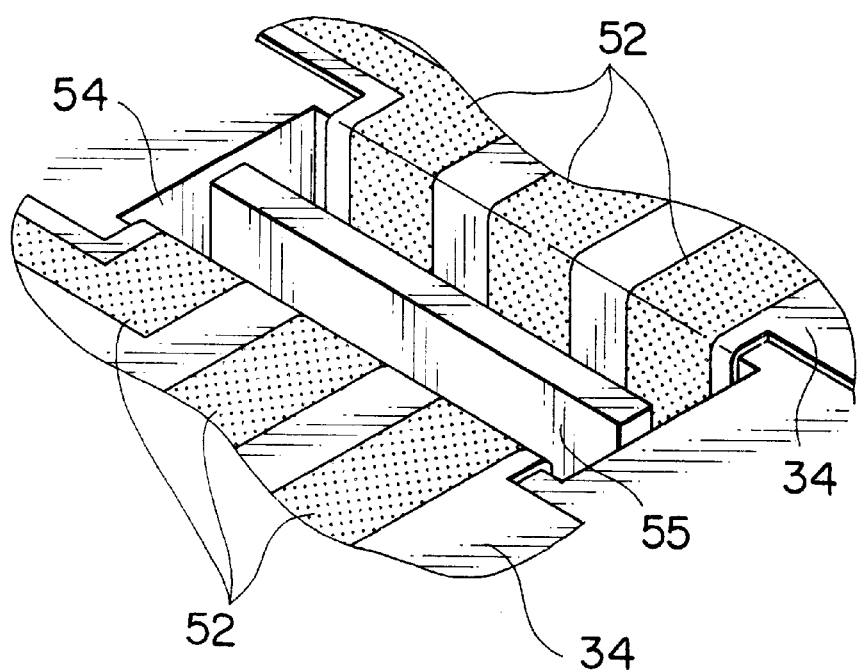
FIG. 6 is a perspective view showing another example of the connector receiving portion of FIG. 1.

Referring to FIG. 6 next, another example of the connector receiving portion 36 is explained. In a connector receiving portion 54 shown in FIG. 6, the FPCs 34 are arranged same as the case of the connector receiving portion 36. Between the FPCs 34, an isolation wall 55 instead of the above HPC 35 projects from the depths-wall (not shown) of the connector receiving portion 54.

The contacting portion 49 of the electric terminal 33 is connected to the FPC 34 electrically when the connector 31 is inserted into the connector receiving portion 54. (Insertion movement of the connector 31 is similar to the above, then omitted here.)

Here, an electric wire to be connected to a load (not shown) is pressure-welded to the wire connecting portion 46. (to be similar, hereinafter)

Figure 7:
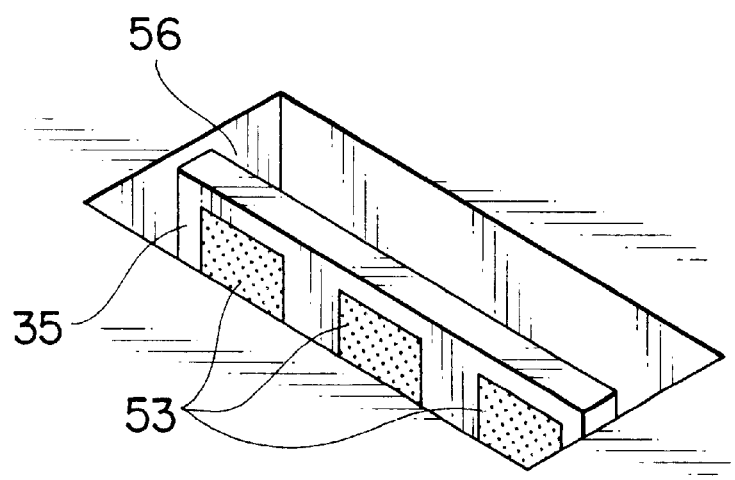
FIG. 7 is also a perspective view showing still another example of the connector receiving portion of FIG. 1.
Figure 8:
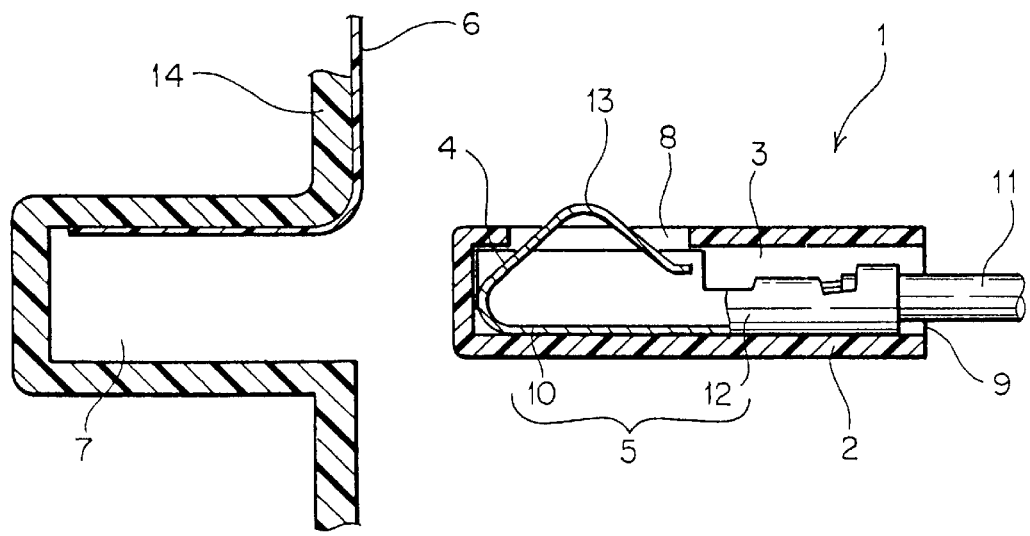
FIG. 8 is a sectional view of a conventional structure consisting of a connector and a connector receiving portion provided with a FPC.
Figure 9:
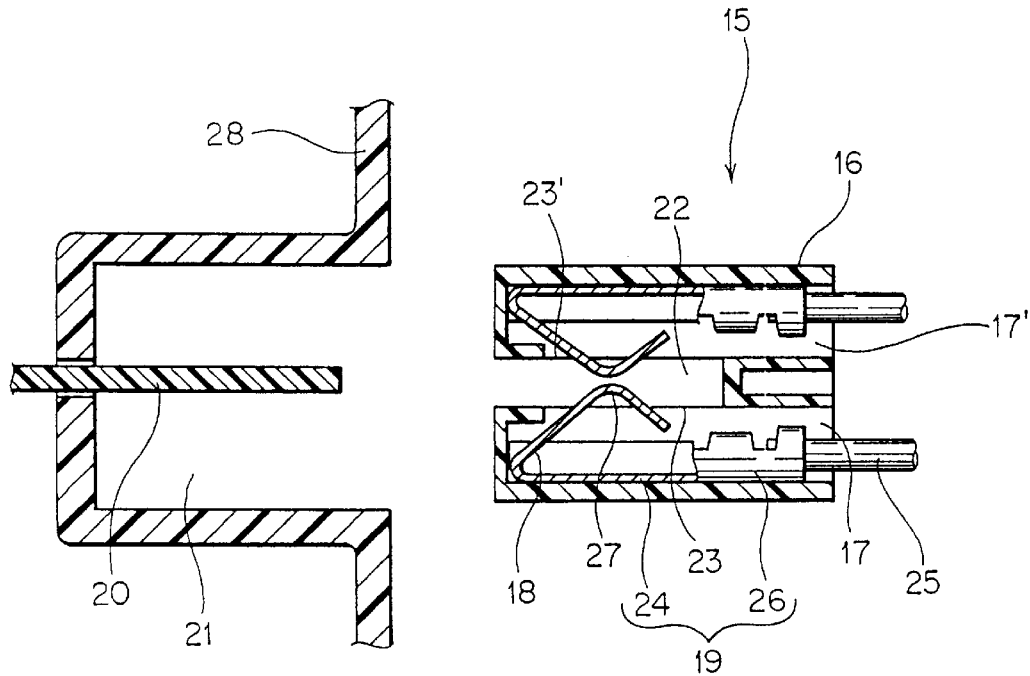
FIG. 9 is a sectional view of a conventional structure consisting of a card-edge connector and a connector receiving portion provided with a HPC.

On the other hand, replacing with the above connector receiving portion 36, a connector receiving portion 56 shown in FIG. 7 can be formed, and the above connector 31 can be inserted.

The HPC 35 is provided in the center of the connector receiving portion 56 shown in FIG. 7, and the contacting portion 50 of the electric terminal 33 and the flat-terminal portion 53 of the HPC 35 are connected by inserting the above connector 31 into the connector receiving portion 56. (Insertion movement of the connector 31 is similar to the above, then omitted here.)

Accordingly, as described above, the connector 31 is applicable to both of a flexible printed circuit and a hard printed circuit each to be provided on the connector receiving portion 36 or the like, and, thereby, common use of a connector, reduction of the number of parts, metal mold and the like, and lightening of parts control are attained simultaneously.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A connector assembly for a printed circuit, comprising:
   a first connector arranged with a printed circuit having a strip-like flat-terminal portion;
   a second connector to be received in said first connector and having a connector housing and a plurality of terminal accommodating chambers symmetrically arranged on both sides of a space, wherein an opening portion is provided on both of an isolation wall facing said space and an opposite isolation wall of each of said terminal accommodating chambers so as to connect each of said terminal accommodating chambers with the outside; and
   an electric terminal, having an elastically contacting piece formed with a pair of contacting portions each arranged to contact said flat-terminal portion of said printed circuit through said opening portion, to be accommodated in each of said terminal accommodating chambers.

2. The connector assembly for printed circuit according to claim 1, wherein said printed circuit of said first connector is any one of a flexible printed circuit, a hard printed circuit, and combination of said flexible printed circuit and said hard printed circuit.

* * * * *